(12) United States Patent
Ushigome

(10) Patent No.: US 9,363,906 B2
(45) Date of Patent: Jun. 7, 2016

(54) ELECTRONIC DEVICE

(71) Applicant: Youichi Ushigome, Akishima (JP)

(72) Inventor: Youichi Ushigome, Akishima (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 356 days.

(21) Appl. No.: 13/746,541

(22) Filed: Jan. 22, 2013

(65) Prior Publication Data

US 2013/0194733 A1 Aug. 1, 2013

(30) Foreign Application Priority Data

Jan. 30, 2012 (JP) ................................. 2012-016950

(51) Int. Cl.

| | |
|---|---|
| *H05K 7/00* | (2006.01) |
| *H05K 5/00* | (2006.01) |
| *H05K 5/02* | (2006.01) |
| *B41J 3/36* | (2006.01) |
| *B41J 15/04* | (2006.01) |

(52) U.S. Cl.
CPC ................. *H05K 5/0221* (2013.01); *B41J 3/36* (2013.01); *B41J 15/042* (2013.01)

(58) Field of Classification Search
CPC ........................................................ B41J 3/36
USPC ............... 361/679.01–679.09, 679.1–679.19, 361/679.21–679.29, 679.31–679.45, 361/679.55–679.6, 724–747; 248/917–924, 248/80–88, 155.1–155.5, 166–173, 248/180.1–186.2, 229.1–231.51, 271.4, 248/292.14, 316.1–316.8
See application file for complete search history.

(56) References Cited

U.S. PATENT DOCUMENTS

| | | | |
|---|---|---|---|
| 1,599,652 A * | 9/1926 | Cranston ........................ 220/323 |
| 6,609,844 B1 * | 8/2003 | Petteruti et al. .................. 400/88 |
| 7,125,181 B2 | 10/2006 | Takabatake et al. | |
| 7,287,850 B2 | 10/2007 | Matsui et al. | |
| 7,825,944 B2 | 11/2010 | Kaiya | |
| 2005/0162497 A1 | 7/2005 | Matsui et al. | |
| 2005/0207813 A1 | 9/2005 | Takabatake et al. | |
| 2007/0139505 A1 | 6/2007 | Kaiya | |
| 2008/0123279 A1 * | 5/2008 | Chih et al. ..................... 361/685 |

FOREIGN PATENT DOCUMENTS

| | | |
|---|---|---|
| JP | 07-285566 | 10/1995 |
| JP | 2007-210133 | 8/2007 |

(Continued)

OTHER PUBLICATIONS

Chinese Office Action for Chinese Patent Application No. 201310036328.4 mailed on Oct. 28, 2014.
Japanese Office Action for Japanese Application No. 2012-016950 mailed on Oct. 9, 2013.
Japanese Office Action for Japanese Application No. 2012-016950 mailed on Mar. 4, 2014.

(Continued)

*Primary Examiner* — Jerry Wu
(74) *Attorney, Agent, or Firm* — Amin, Turocy & Watson LLP; Gregory Turocy

(57) ABSTRACT

An electronic device of the present invention is provided with a cover which is rotatably attached to a device case in an openable/closable manner and conceals a storage section provided in the device case; an operating member which is rotatably attached to the device case and exposed outside of the device case; and a lock member which locks the cover in a state where the cover conceals the storage section, and lifts the cover upward in an opening direction when the lock on the cover is released by a rotation operation of the operating member.

6 Claims, 7 Drawing Sheets

(56) References Cited

FOREIGN PATENT DOCUMENTS

| | | |
|---|---|---|
| JP | 2009-190413 | 8/2009 |
| JP | 2009-190414 | 8/2009 |

OTHER PUBLICATIONS

European Search Report for Application No. 13153051.1-1701 Dated Apr. 26, 2013, 6 pgs.

* cited by examiner

ELECTRONIC DEVICE

CROSS-REFERENCE TO RELATED APPLICATION

This application is based upon and claims the benefit of priority from the prior Japanese Patent Application No. 2012-016950, filed Jan. 30, 2012, the entire contents of which is incorporated herein by reference.

BACKGROUND OF THE INVENTION

1. Field of the Invention

The present invention relates to electronic devices, such as mobile information terminals and mobile personal computers.

2. Description of the Related Art

For example, as described in Japanese Patent Application Laid-Open (Kokai) Publication No. 2007-210133, a mobile electronic device equipped with a printer is known. This device is comprised with an opening and closing apparatus in which a printer cover conceals a recording paper storage section formed in the device case with an openable/closable cover.

This type of cover opening and closing apparatus is configured such that one end portion of the cover is rotatably attached to the device case and the other end portion of the cover is positioned on the opposite side in the rotational center of this cover. A platen roller which faces the print head in the device case is removably attached to a rotation shaft enabling free rotation. The rotation shaft of the platen roller is locked by a lock groove provided in the device case when the cover is closed which conceals the recording paper storage section.

In this structure, a hook section in a flat spring shape that resiliently projects into the locking groove is provided in the device case. Accordingly, when the cover is closed, which conceals the recording paper storage section, the rotation shaft of the platen roller is inserted into the locking groove against the resilient force of the hook section, whereby the hook section resiliently returns and locks the rotation shaft into the locking groove. Therefore, the cover opening and closing apparatus locks the rotation shaft in a state where the cover is closed.

However, this type of cover opening and closing apparatus has a problem as follows: when the hook section in a flat spring shape has weak resilient force, the rotation shaft of the platen roller may detach from the locking groove of the device case during use, whereby the cover may open; when the hook section in a flat spring shape has a strong resilient force, the rotation shaft of the platen roller cannot be easily withdrawn from the locking groove of the device case when the cover is opened, whereby opening and closing operations of the cover cannot be easily performed.

To solve this problem, the above-described cover opening and closing apparatus in Japanese Patent Application Laid-Open (Kokai) Publication No. 2007-210133 is configured such that an operating lever is rotatably attached to the device case and provided with a lock tab. As a result, by the operating lever being rotated and the lock tab being retractably inserted into the locking groove of the device case, the rotation shaft of the platen roller is locked into the locking groove of the device case by the lock tab.

In this type of a cover opening and closing apparatus, in order that the cover is opened, the operating lever is rotated and the lock tab is disengaged from within the locking groove of the device case, whereby the lock on the rotation shaft of the platen roller inserted into the locking groove of the device case is released. And then, the cover is rotated in an opening direction in this state, whereby the rotation shaft is pulled out of the locking groove. As a result, the cover can be opened.

However, in this type of cover opening and closing apparatus having an operating lever, the cover cannot open merely by rotating the operating lever and releasing the lock on the rotation shaft of the platen roller by the lock tab. In other words, the cover cannot open unless the cover is rotated in the opening direction in a state where the lock is released, whereby the rotation shaft is pulled out of the locking groove. That is, the lock releasing operation and the cover opening operation for opening the cover are separate operations. Therefore, there is a problem in that the opening and closing operations of the cover are troublesome, and opening and closing operability of the cover is poor.

SUMMARY OF THE INVENTION

An object of the present invention is to consecutively perform an operation for releasing the lock on a cover by a lock member and an operation for opening the cover as a series of operations by a simple method of rotating an operating member.

In accordance with one aspect of the present invention, there is provided an electronic device comprising: a cover which is rotatably attached in an openable/closable manner to a device case and conceals a storage section provided in the device case; an operating member which is rotatably attached to the device case and exposed outside of the device case; and a lock member which locks the cover in a state where the cover conceals the storage section, and lifts the cover upward in an opening direction when the lock on the cover is released by a rotation operation of the operating member.

In the present invention, an operation for releasing the lock on a cover by a lock member and an operation for opening the cover can be consecutively performed as a series of operations by a simple method of rotating an operating member.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWING

FIG. 4A and FIG. 4B are diagrams of a cover opening and closing apparatus of the mobile information terminal shown in FIG. 1, in which FIG. 4A is an enlarged side view of main sections of the cover opening and closing apparatus in a state where the printer cover is closed, and FIG. 4B is an enlarged cross-sectional view of main sections of the cover opening and closing apparatus positioned within the device case in this state;

FIG. 5A and FIG. 5B are diagrams of the cover opening and closing apparatus of the mobile information terminal shown in FIG. 4A and FIG. 4B, in an unlocked state where an operating member is rotated and the lock on the printer cover by a lock member is released, in which FIG. 5A is an enlarged side view of main sections of the cover opening and closing apparatus in the unlocked state, and FIG. 5B is an enlarged cross-sectional view of main sections of the cover opening and closing apparatus positioned within the device case in the unlocked state;

FIG. 6A and FIG. 6B are diagrams of the cover opening and closing apparatus of the mobile information terminal shown in FIG. 5A and FIG. 5B, in a state where the operating member further rotates and the lock member slightly lifts the printer cover upward, in which FIG. 6A is an enlarged side view of main sections of the cover opening and closing apparatus in this state, and FIG. 6B is an enlarged cross-sectional view of main sections of the cover opening and closing apparatus positioned within the device case in this state; and FIG. 7A and FIG. 7B are diagrams of the cover opening and closing apparatus of the mobile information terminal shown in FIG. 6A and FIG. 6B, in a state where the printer cover is opened and stood upright on the device case, in which FIG. 7A is an enlarged side view of main sections of the cover opening and closing apparatus in this state and FIG. 7B is an enlarged cross-sectional view of main sections of the cover opening and closing apparatus positioned within the device case in this state.

DETAILED DESCRIPTION OF THE PREFERRED EMBODIMENTS

Figure 1:
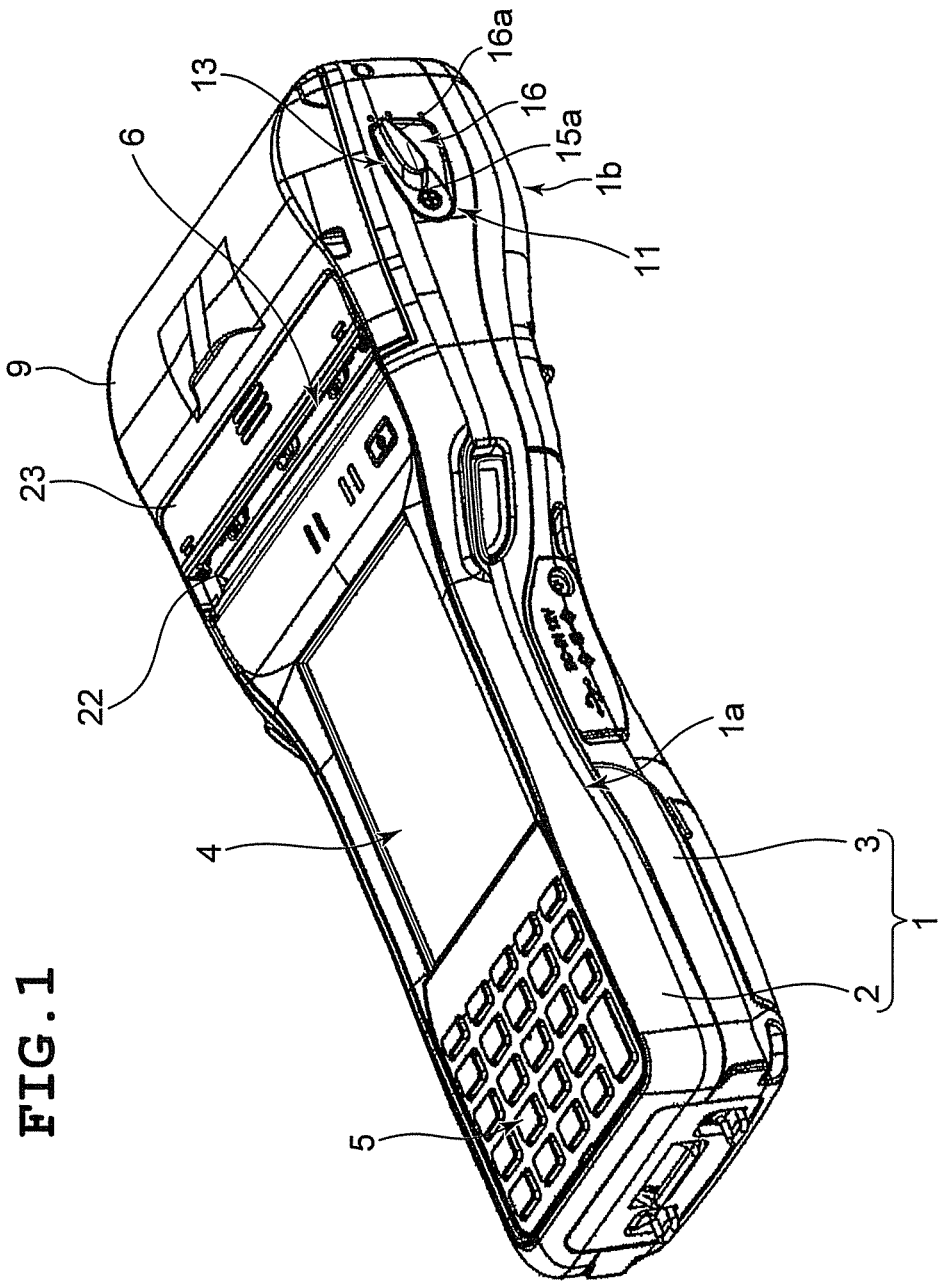
FIG. 1 is a perspective view of an embodiment in which the present invention is applied to a mobile information terminal.
Figure 2:
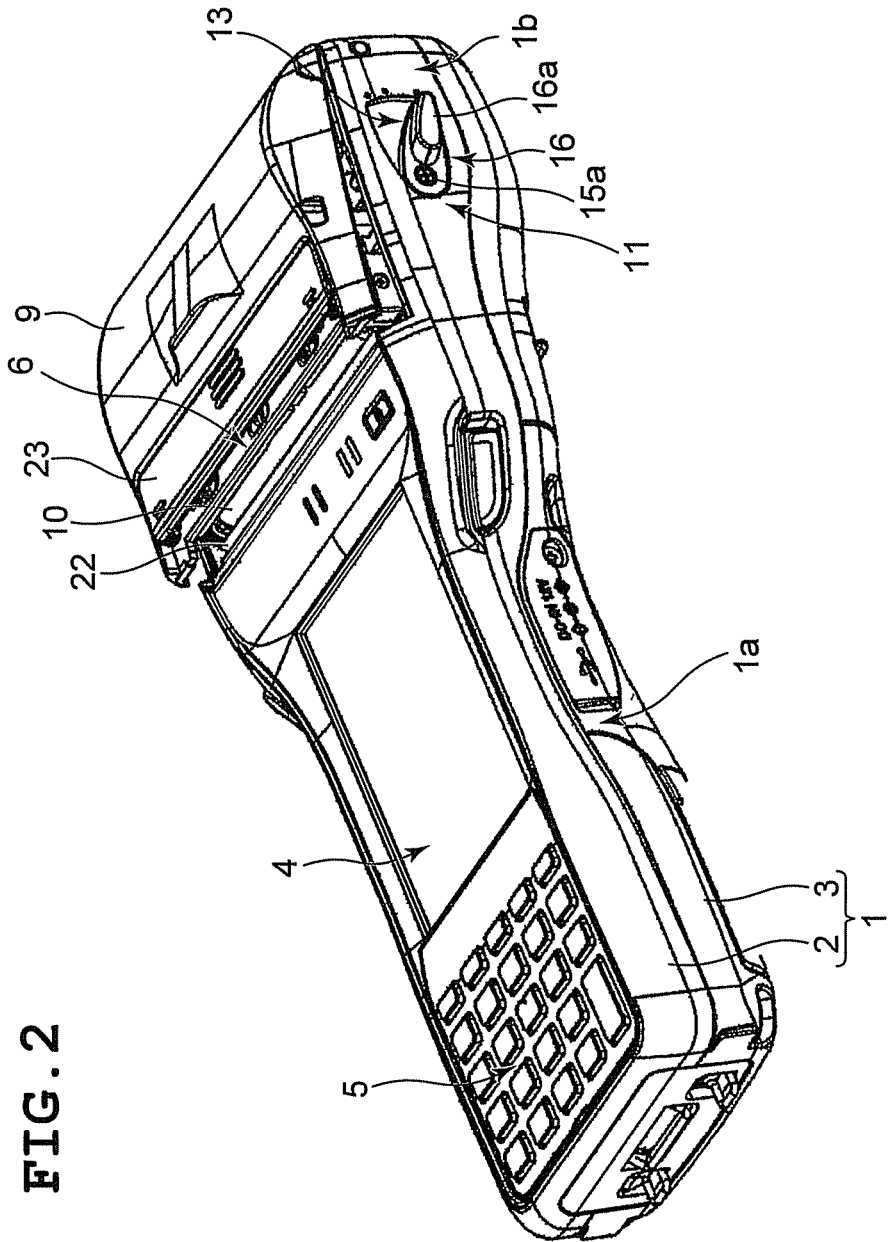
FIG. 2 is a perspective view of the mobile information terminal shown in FIG. 1, in a state where the lock on a printer cover is released and the printer cover is lifted onto a device case.
Figure 3:
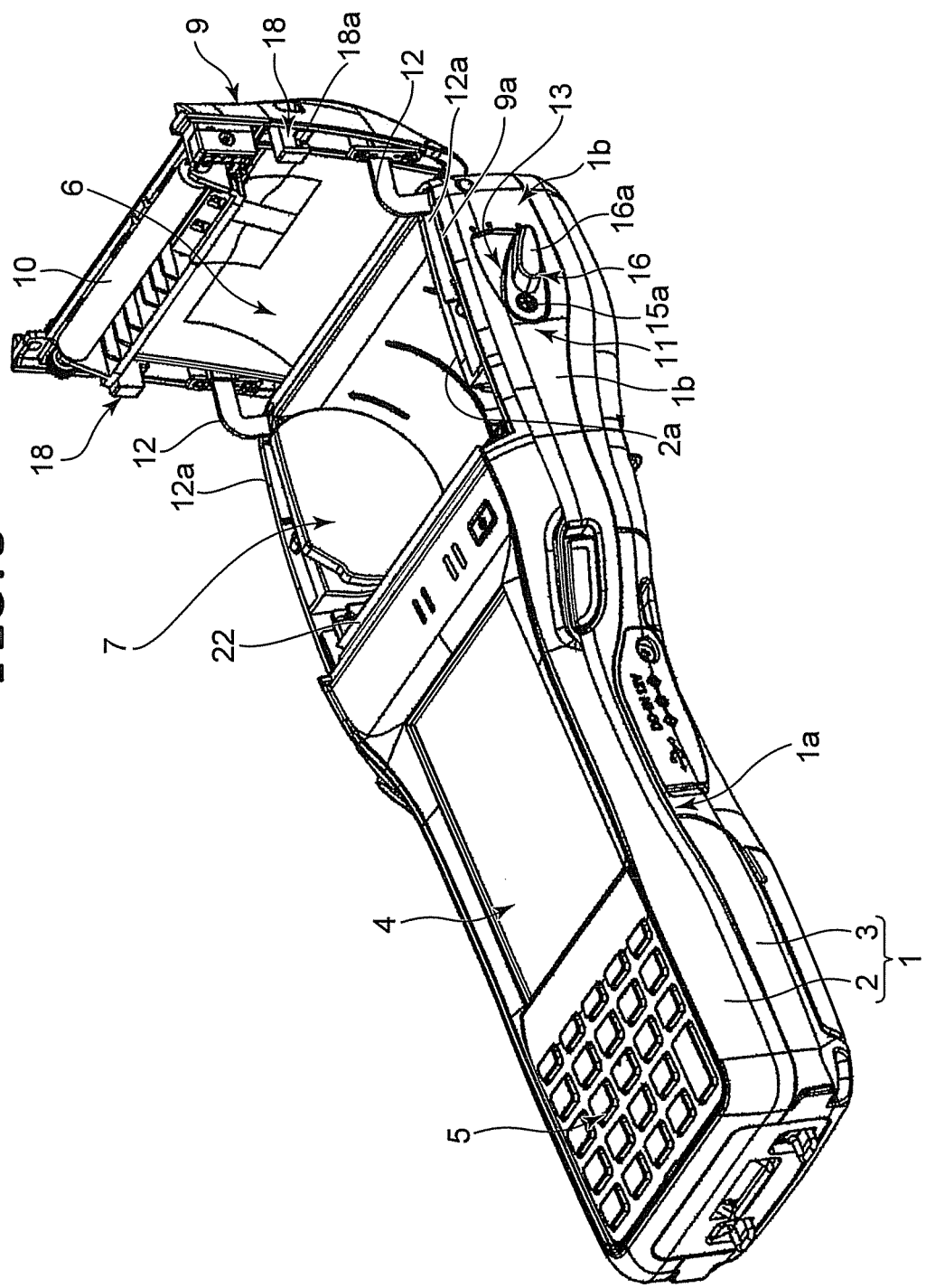
FIG. 3 is a perspective view of the mobile information terminal shown in FIG. 2, in a state where the printer cover is opened and stood upright on the device case.

An embodiment in which the present invention has been applied to a mobile information terminal will hereinafter be described with reference to FIG. 1 to FIG. 7. The mobile information terminal includes a device case 1, as shown in FIG. 1 to FIG. 3. The device case 1 includes an upper case 2 and a lower case 3.

The device case 1 is formed into a substantially rectangular box shape that is overall elongated in a vertical direction (left/right direction in FIG. 1), as shown in FIG. 1 to FIG. 3. In this structure, the base side of the device case 1 (left side in FIG. 1) is formed into a gripping section 1a having a narrow width, and the tip side (right side in FIG. 1) is formed into a printer mounting section 1b having a wide width. An input display section 4 and a key input section 5 are provided in the gripping section 1a in the upper case 2 of the device case 1.

The input display section 4 is configured such that a transparent touch panel is arranged on the front surface of a display panel. As a result, information displayed on the display panel can be viewed through the transparent touch panel. Accordingly, a user can input information by performing a touch operation on the touch panel while viewing the displayed information. The key input section 5 includes various keys, such as a numeric keypad and a function key. Information is inputted by key operation.

A printer section 6 is provided in the printer mounting section 1b in the upper case 2 of the device case 1, as shown in FIG. 1 to FIG. 4. The printer section 6 includes a recording paper storage section 7 that is provided within the device case 1 in the printer mounting section 1b, a print head 8 that prints information while sequentially drawing out recording paper (not shown) stored in the recording paper storage section 7, and a printer cover 9 that conceals the recording paper storage section 7 in an openable/closable manner.

The recording paper storage section 7 is formed in a recessed shape with a substantially semicircular arc within the device case 1 and rotatably stores therein the roll of recording paper (not shown), as shown in FIG. 1 to FIG. 4. In this structure, a recording paper insertion opening 2a is provided in the upper case 2 corresponding to the recording paper storage section 7. The print head 8, which is a thermal print head, is provided facing the recording paper storage section 7 positioned on the input display section 4 side within the device case 1 and, as shown in FIG. 4B.

The printer cover 9 is formed into a curved surface that projects upward and curves in a substantially circular arc shape, as shown in FIG. 1 to FIG. 3. The periphery edge portion of the printer cover 9 is formed into a frame shape that corresponds to the outer periphery of the recording paper insertion opening 2a of the upper case 2. In this structure, a waterproof gasket 9a is provided in the frame-shaped periphery edge portion of the printer cover 9, excluding the edge portion positioned on the print head 8 side, or in other words, a position corresponding to a recording paper ejection opening 22, described hereafter. When the cover printer 9 is closed and conceals the recording paper storage section 7, the waterproof gasket 9a comes into elastic contact with the outer periphery of the recording paper insertion opening 2a of the upper case 2.

A platen roller 10 is rotatably provided on the inner surface of the end portion of the printer cover 9 positioned on the input display section 4 side, as shown in FIG. 3. When the printer cover 9 is closed which conceals the recording paper storage section 7, the platen roller 10 is placed in contact with or near the print head 8, as shown in FIG. 3 and FIG. 4. As a result, the recording paper is fed between the print head 8 and the platen roller 10, and then the print head 8 prints information on the recording paper while pressing the recording paper against the platen roller 10.

Furthermore, the printer cover 9 conceals the recording paper storage section 7 by a cover opening and closing apparatus 11 in an openable/closable manner, as shown in FIG. 3. The cover opening and closing apparatus 11 includes a pair of rotating support shafts 12 that rotatably support the printer cover 9 in relation to the device case 1, a pair of operating members 13 that are operably attached to the device case 1 and exposed outside of the device case 1, and a pair of lock members 14 that lock the printer cover 9 when the recording paper storage section 7 is concealed, as shown in FIG. 4 and FIG. 7.

The pair of rotating support shafts 12 are respectively provided on both sides of the end portion positioned in the longitudinal direction of the device case 1, as shown in FIG. 3 and FIG. 7. The one end portion of the rotating support shaft 12, which is bent into a substantially L-shape, is rotatably attached to the device case 1, and the other end portion is rotatably attached to the print cover 9.

In other words, one end portion of the rotating support shaft 12 is rotatably attached to an end portion within the device case 1 positioned on the opposite side of the print head 8 across the recording paper storage section 7, and the other end portion is rotatably attached to an end portion of the printer cover 9 positioned on the opposite side of the platen roller 10, as shown in FIG. 3 and FIG. 7. In this structure, shaft storage sections 12a into which the pair of rotating support shafts 12 are respectively inserted are provided in both side portions of the device case 1 where the pair of rotating support shafts 12 are positioned.

As a result, in order that the printer cover 9 opens by rotating around the pair of rotating support shafts 12, the pair of rotating support shafts 12 rotates in a manner to lift upward the end portion of the printer cover 9 positioned on the opposite side of the platen roller 10 and rotates in a manner to direct upward the end portion of the printer cover 9 positioned on the platen roller 10 side. As a result, the printer cover 9 opens in a state of standing upright on the end portion of the device case 1 positioned on the rotating support shafts 12 side, as shown in FIG. 3 and FIG. 7.

The pair of operating members 13 respectively includes operation rotating sections 15 that are rotatably attached to the both side portions of the device case 1, and operating lever sections 16 that are exposed to the outside of the device case 1 and rotate the operation rotating sections 15, as shown in FIG. 4 and FIG. 7. The operation rotating sections 15 respectively include rotation shafts 15*a* and rotation conveyance plates 15*b*, as shown in FIG. 4 to FIG. 7. The rotation shafts 15*a* are rotatably attached to the both side portions of the device case 1 positioned on the both sides of the recording paper storage section 7, respectively.

In this structure, in a state where the rotation shaft 15*a* is rotatably attached to the side portion of the device case 1, an outer end portion of the rotation shaft 15*a* projects outside of the device case 1 and an inner end portion projects within the device case 1, as shown in FIG. 4 to FIG. 7. The rotation conveyance plate 15*b* is attached to the inner end portion of the rotation shaft 15*a*. In addition, the operating lever section 16 is attached to the outer end portion of the rotation shaft 15*a*. As a result, the rotation shaft 15*a* rotates the rotation conveyance plate 15*b* by rotating corresponding to the rotation operation of the operating lever section 16.

The operating lever section 16 is formed into a substantially elliptical shape, as shown in FIG. 1 to FIG. 3. One end portion of the operating lever section 16 is attached to the outer end portion of the rotation shaft 15*a* of the operation rotating section 15, and a tip end portion 16*a* positioned on the opposite side of the one end portion is placed projecting towards the rotating support shaft 12 side that is the rotational center of the printer cover 9. In this state, the tip end portion 16*a* rotates in the up/down direction.

The pair of lock members 14 respectively include interlocking rotating sections 17 that rotate by the rotation operation of the operating members 13, lock sections 20 that are provided in the interlocking rotating sections 17 and that engage with engaging sections 18 of the printer cover 9 and lock the printer cover 9 in a state where the printer cover 9 conceals the recording paper storage section 7, and a lifting upward section 21 that is provided in the interlocking rotating section 17 and that lifts upward the printer cover 9 in an opening direction when the lock on the printer cover 9 by the lock section 20 is released.

In this structure, a pair of engaging sections 18 are respectively provided on both sides of the printer cover 9 projecting towards the lock members 14, as shown in FIG. 4 to FIG. 7. The pair of engaging sections 18 are respectively provided with groove sections 18*a* that are open in the direction perpendicular to the opening and closing direction of the printer cover 9, or in other words, towards the rotating support shafts 12 side. The interlocking rotating section 17 is attached to the rotation conveyance plate 15*b* of the operating member 13 and rotates corresponding to the rotation operation of the operating lever section 16.

The lock section 20 is a projecting section that projects in the direction perpendicular to the opening and closing direction of the printer cover 9, or in other words, towards the opposite side of the rotating support shaft 12, and is provided in the outer periphery portion of the interlocking rotating section 17, as shown in FIG. 4 and FIG. 7. In order that the printer cover 9 conceals the recording paper storage section 7, the lock section 20 is inserted into the groove section 18*a* provided in the engaging section 18 of the printer cover 9 and pulls downward the engaging section 18, whereby the printer cover 9 is pressed against the device case 1.

Figure 5A:
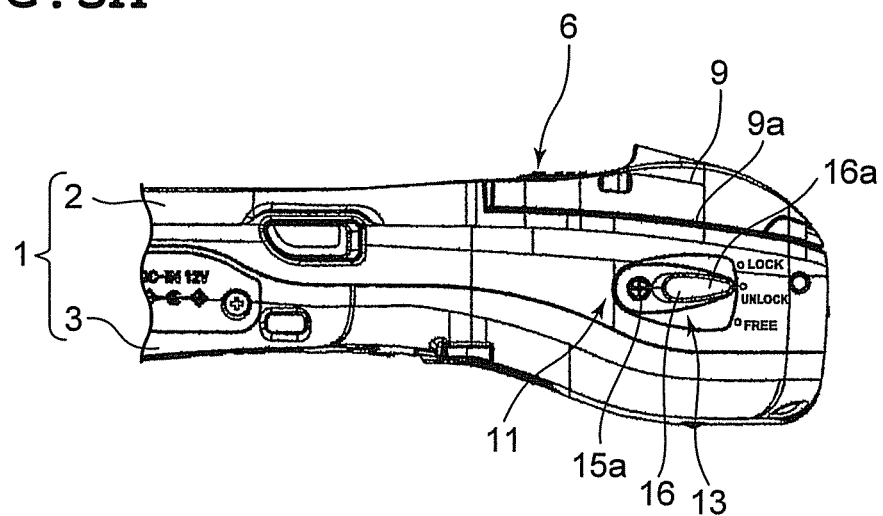
Figure 5B:
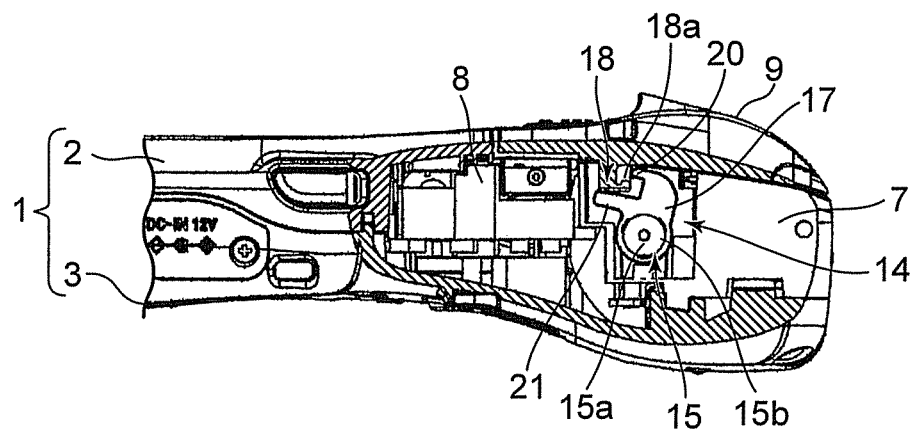
Figure 6A:
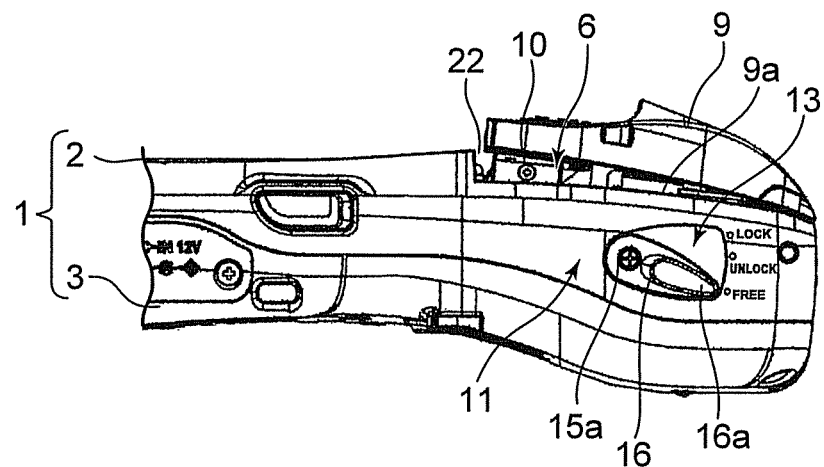
Figure 6B:
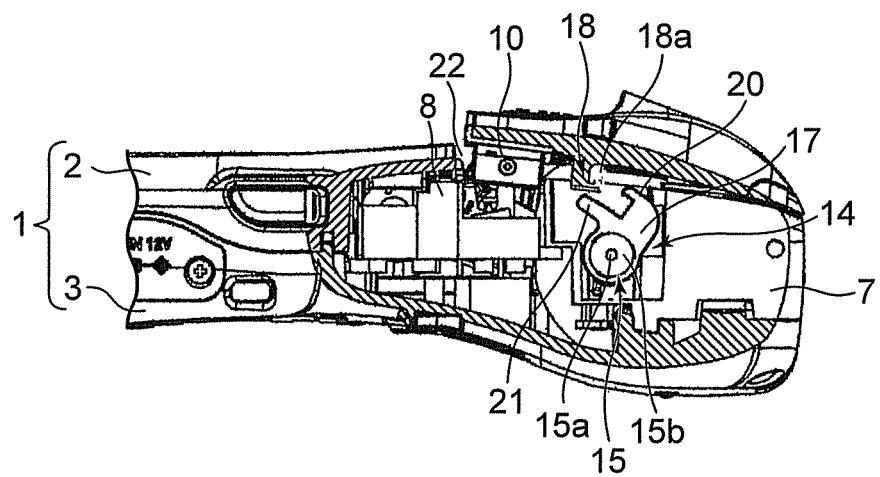

In other words, when the operating lever section 16 is rotated and the lock section 20 disengages from the groove section 18*a* of the engaging section 18 of the printer cover 9, the lock section 20 moves towards the rotating support shaft 12 side and gradually moves obliquely downward while rotating in the clockwise direction with the interlocking rotating section 17, as shown in FIG. 6B. In addition, in order that the printer cover 9 closes, the lock section 20 comes close to the groove section 18*a* of the engaging section 18 of the printer cover 9 while rotating in the counter-clockwise direction with the interlocking rotating section 17 and gradually moving upward, as shown in FIG. 5B.

Figure 4A:
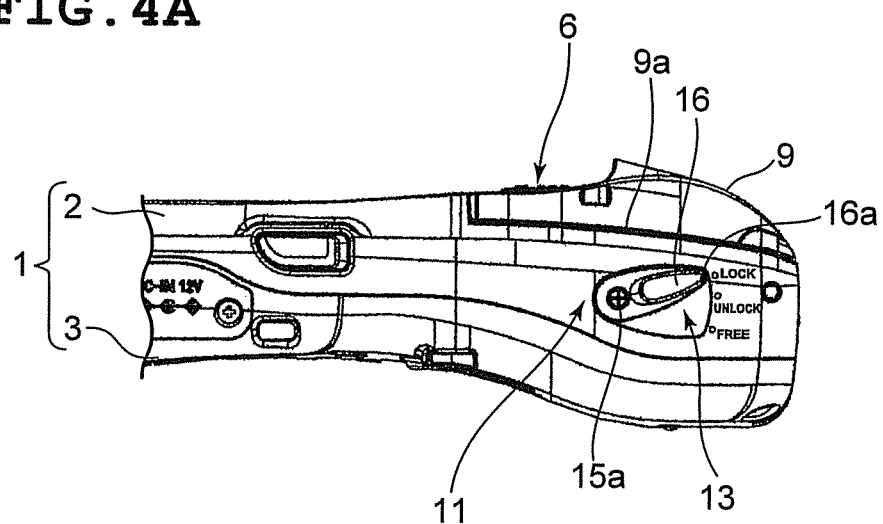
Figure 4B:
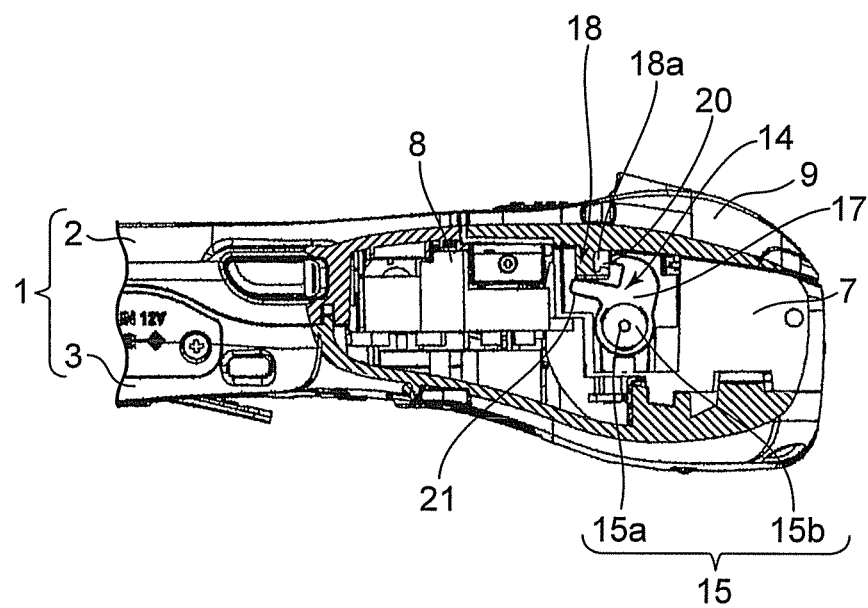

Furthermore, in order that the printer cover 9 conceals the recording paper storage section 7 and completely closes, the lock section 20 moves to the uppermost portion while rotating in the counter-clockwise direction with the interlocking rotating section 17, and then is inserted into the groove section 18*a* of the engaging section 18 of the printer cover 9, thereby pulling downward the engaging section 18, as shown in FIG. 4B. As a result, the printer cover 9 is pressed against the device case 1.

On the other hand, the lifting upward section 21 is a projecting section that is provided projecting in the direction perpendicular to the opening and closing direction of the printer cover 9, or in other words, towards the opposite side of the rotating support shaft 12, as shown in FIG. 4 to FIG. 6. In other words, the lifting upward section 21 is formed in a position positioned nearer to the rotation shaft 15*a* side than the lock section 20 of the interlocking rotating section 17, such that the projecting length of the lifting upward section 21 is longer than that of the lock section 20. When the lock section 20 is engaged by being inserted into the groove section 18*a* of the engaging section 18 of the printer cover 9, the lifting upward section 21 is placed close to the underside of the engaging section 18.

As a result, in order that the printer cover 9 is opened, the interlocking rotating section 17 rotates in the clockwise direction by the rotation operation of the operating member 13 and the lock section 20 disengages from the groove section 18*a* of the engaging section 18. Then, the lifting upward section 21 lifts the engaging section 18 upward corresponding to the rotation of the interlinking rotating section 17. As a result, the printer cover 9 is lifted upward in the opening direction, as shown in FIG. 5B and FIG. 6B.

In order that the printer cover 9 is closed, the engaging section 18 of the printer cover 9 comes into contact with the lifting upward section 21 from above and presses the lifting upward section 21 downward, thereby rotating the interlocking rotating section 17 in the counter-clockwise direction. As a result, the lock section 20 is engaged by being inserted into the groove section 18*a* of the engaging section 18, whereby the printer cover 9 is pressed against the device case 1, as shown in FIG. 4B and FIG. 5B.

An ejection cover 23 that conceals the recording paper ejection opening 22 is slidably attached to the printer cover 9 in an openable/closable manner, as shown in FIG. 1. In this structure, the recording paper ejection opening 22 is used to eject above the device case 1, the recording paper on which information is being printed by the print head 8. The recording paper ejection opening 22 is provided in a slit shape corresponding to the position where the print head 8 and the platen roller 10 face each other when the printer cover 9 closes.

The ejection cover 23 is formed into a band plate shape that is slightly longer than the recording paper ejection opening 22 and is slidably attached to the printer cover 9 along the longitudinal direction of the device case 1, as shown in FIG. 1. As a result, when the printer section 6 is not in use, the ejection cover 23 is slid towards the input display section 4 side and conceals the recording paper ejection opening 22, thereby preventing water drops, such as rain, from entering through the recording paper ejection opening 22 into the device case 1.

In addition, when the printer section 6 is used, the ejection cover 23 is slid in the direction opposite to the input display section 4 and the recording paper ejection opening 22 is opened, as shown in FIG. 1. As a result, the recording paper on which information is being printed by the print head 8 ejects outside of the device case 1 from the recording paper ejection opening 22.

Next, the mechanism of the above-described printer section 6 of the mobile information terminal will be described.

When information displayed on the input display section 4 of the device case 1 is printed on the recording paper by the printer section 6, first, the ejection cover 23 of the printer cover 9 is slid and the recording paper ejection opening 22 is opened. At this time, the recording paper is placed between the print head 8 and the platen roller 10 in advance and in a state where the printer cover 9 is closed.

In this state, when the print head 8 starts printing, the information displayed on the input display section 4 is printed on the recording paper line by line, and the platen roller 10 rotates to sequentially eject the printed recording paper from the recording paper ejection opening 22. Accordingly, the roll-form recording paper stored in the recording paper storage section 7 is sequentially fed between the print head 8 and the platen roller 10, and following information is sequentially printed on this fed recording paper. The information is printed on the recording paper in this way.

When exchanging the recording paper stored in the recording paper storage section 7 of the printer section 6, the operating lever sections 16 of the operating members 13 exposed on both sides of the device case 1 are rotated, whereby the printer cover 9 is opened, as shown in FIG. 6A and FIG. 6B. At this time, the tip end portions 16a of the operating lever sections 16 are pressed downward, and the operating lever sections 16 are rotated in the clockwise direction around the rotation shafts 15a of the operation rotating sections 15, as shown in FIG. 4A to FIG. 6B.

As a result, the rotation conveyance plates 15b of the operation rotating sections 15 rotate together with the rotation operation of the operating lever sections 16, and the interlocking rotating sections 17 of the lock members 14 rotate in the clockwise direction following the rotation of the rotation conveyance plates 15b, whereby the lock sections 20 disengage from the groove sections 18a of the engaging sections 18 of the printer cover 9, as shown in FIG. 4A to FIG. 6B.

In other words, when the operating lever sections 16 rotate from the state shown in FIG. 4A to the state shown in FIG. 5A, the interlocking rotating sections 17 rotate following the rotation of the operating lever sections 16. Accordingly, the lock sections 20 rotate in the clockwise direction following the rotation of the interlocking rotating sections 17, or in other words, from the state shown in FIG. 4B to the state shown in FIG. 5B. As a result, the rotated lock sections 20 disengage from the groove sections 18a of the engaging sections 18 of the printer cover 9.

Then, when the operating lever sections 16 further rotate from the state shown in FIG. 5A to the state shown in FIG. 6A, the interlocking rotating sections 17 further rotate following the rotation of the operating lever sections 16. Accordingly, the lifting upward sections 21 of the lock members 14 rotate in the clockwise direction following the rotation of the interlocking rotating sections 17, or in other words, from the state shown in FIG. 5B to the state shown in FIG. 6B. As a result, the rotated lifting upward sections 21 lift the engaging section 18 of the printer cover 9 upward.

Figure 7A:
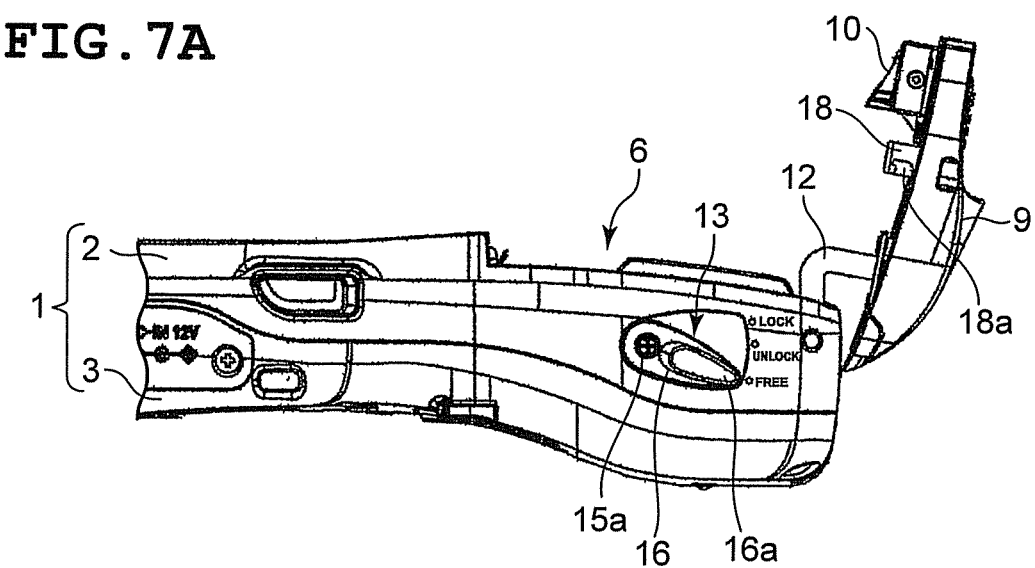
Figure 7B:
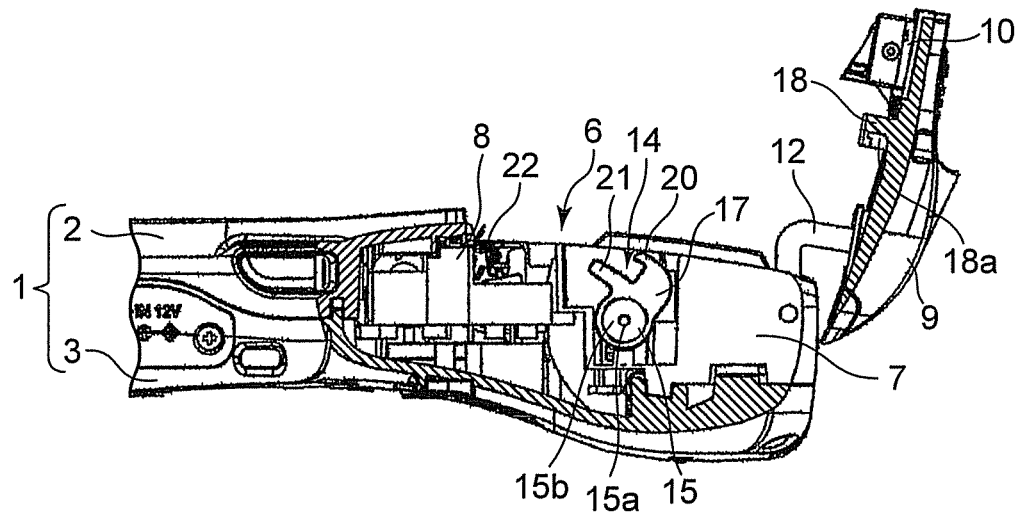

Accordingly, the printer cover 9 is lifted upward by the lifting upward sections 21 of the lock members 14. Then, the printer cover 9 rotates around the rotating support shafts 12 in the opening direction, thereby hovering above the device case 1. And then, the hovered printer cover 9 is pulled upward and rotated around the rotating support shafts 12 in the opening direction to stand upright on the device case 1, as shown in FIG. 3, FIG. 7A, and FIG. 7B. As a result, the roll of recording paper can be exchanged.

When the printer cover 9 is closed after the recording paper is exchanged, the printer cover 9 is rotated around the rotating support shafts 12 in a closing direction from the state shown in FIG. 3, FIG. 7A, and FIG. 7B. As a result, the printer cover 9 is placed on the device case 1 to conceal the recording paper storage section 7, as shown in FIG. 6A and FIG. 6B. At this time, the printer cover 9 is placed on the device case 1 in a slightly hovered state because the engaging sections 18 of the printer cover 9 come into contact with the lifting upward sections 21 of the lock members 14.

In this state, when the end portion of the printer cover 9 where the platen roller 10 is positioned is pressed downward, the lifting upward sections 21 of the lock members 14 are pressed downward by the engaging sections 18 of the printer cover 9, as shown in FIG. 5B. Accordingly, the interlocking rotating sections 17 rotate in the counter-clockwise direction around the rotation shafts 15a of the operating members 13, and the operating lever sections 16 of the operating member 13 also rotate in the counter-clockwise direction, as shown in FIG. 5A.

As a result, the lock sections 20 rotate with the interlocking rotating sections 17, and then are engaged by being inserted into the groove sections 18a of the engaging sections 18 of the printer cover 9, as shown in FIG. 4B. At this time, the lock sections 20 also press the engaging sections 18 downward by being inserted into the groove sections 18a of the engaging sections 18 of the printer cover 9. Therefore, the periphery edge portion of the printer cover 9 presses the waterproof gasket 9a against the periphery edge portion of the recording paper insertion opening 2a of the upper case 2, whereby the printer cover 9 conceals the recording paper storage section 7. At this time, the operating lever sections 16 of the operating members 13 rotate in the counter-clockwise direction, whereby the tip end portions 16a of the operating lever sections 16 are positioned obliquely upward, as shown in FIG. 4A.

As described above, the cover opening and closing apparatus 11 of the printer section 6 of the mobile information terminal comprises: the printer cover 9 which is rotatably attached in an openable/closable manner to the device case 1 and conceals the recording paper storage section 7 provided in the device case 1; the operating members 13 which is rotatably attached to the device case 1 and exposed outside of the device case 1; and the lock members 14 which locks the printer cover 9 in a state where the printer cover 9 conceals the recording paper storage section 7, and lifts the printer cover 9 upward in an opening direction when the lock on the printer cover 9 is released by a rotation operation of the operating members 13. As a result, opening and closing operability of the printer cover 9 can be markedly improved.

In other words, in the cover opening and closing apparatus 11 of the printer section 6, the printer cover 9 can be locked by the lock members 14 when the printer cover 9 is closed and conceals the recording paper storage section 7. When the printer cover 9 is opened, the lock on the printer cover 9 by the lock members 14 can be released by the operating members 13 being rotated, and then the printer cover 9 can be lifted upward in the opening direction.

Therefore, in the cover opening and closing apparatus 11, the operation for releasing the lock on the printer cover 9 by the lock members 14 and the operation for opening the printer cover 9 can be consecutively performed as a series of operations by a simple method of rotating the operating members 13. As a result, opening and closing operability of the printer cover 9 can be improved, and a cover opening and closing apparatus 11 having good opening and closing operability can be provided. Accordingly, when the mobile information terminal including the cover opening and closing apparatus 11 is used outdoors, the roll of recording paper can be quickly and efficiently and exchanged without the roll being dropped.

In this case, the lock member 14 includes: the interlocking rotating section 17 that rotates by the rotation operation of the operating member 13; the lock section 20 that is provided in the interlocking rotating section 17, and that engages with the engaging section 18 of the printer cover 9 and locks the printer cover 9 in a state where the printer cover 9 conceals the recording paper storage section 7; and the lifting upward section 21 that is provided in the interlocking rotating section 17 and lifts the printer cover 9 upward in the opening direction when the lock on the printer cover 9 by the lock section 20 is released. As a result of this configuration, when the printer cover 9 is opened, the operation for releasing the lock on the printer cover 9 by the lock members 14 and the operation for opening the printer cover 9 can be consecutively performed as a series of operations.

In other words, in the cover opening and closing apparatus 11, in order that the printer cover 9 is opened, the interlocking rotating sections 17 of the lock members 14 rotate by the rotation operation of the operating members 13, whereby the lock sections 20 rotate corresponding to the rotation of the interlocking rotating sections 17. As a result, the lock on the engaging sections 18 of the printer cover 9 can be released. Furthermore, when the interlocking rotating sections 17 further rotate in this state, the lifting upward sections 21 rotate corresponding to the rotation of the interlocking rotating sections 17, thereby lifting the engaging sections 18 of the printer cover 9. As a result, the printer cover 9 is opened. Therefore, the operation for releasing the lock on the printer cover 9 by the lock members 14 and the operation for opening the printer cover 9 can be consecutively performed as a series of operations simply by performing a rotation operation of the operating members 13.

In addition, in the cover opening and closing apparatus 11, in order that the printer cover 9 is closed, when the printer cover 9 is placed on the device case 1 to cover the recording paper storage section 7, the engaging sections 18 of the printer cover 9 come into contact with the lifting upward sections 21 of the lock members 14. When the end portion of the printer cover 9 is pressed downward in this state, the lifting upward sections 21 of the lock members 14 are pressed downward by the engaging sections 18 of the printer cover 9. As a result, the interlocking rotating sections 17 can be rotated and the lock sections 20 can be engaged with the engaging sections 18 of the printer cover 9. Therefore, the printer cover 9 can be easily and unfailingly locked and closed without the operating members 13 being operated. Accordingly, closing operability of the printer cover 9 is favorable.

In this structure, the engaging sections 18 of the printer cover 9 respectively have the groove sections 18a that are provided to be open in the direction perpendicular to the opening and closing direction of the printer cover 9. The lock sections 20 are projecting sections that are respectively inserted into the groove sections 18a of the engaging sections 18 and press the printer cover 9 downward. The lifting upward sections 21 are projecting sections that respectively lift the engaging sections 18 upward by performing the rotation operation of the operating members 13 when the lock sections 20 disengage from the groove sections 18a of the engaging sections 18. This configuration enables the structure to be simple and the printer cover 9 to be reliably and favorably opened and closed.

In other words, in the cover opening and closing apparatus 11, the lock sections 20 can be engaged by being inserted into the groove sections 18a of the engaging sections 18 of the printer cover 9 by the rotation of the interlocking rotating sections 17. As a result, the printer cover 9 can be unfailingly locked.

In addition, the lock sections 20 can be disengaged from the groove sections 18a of the engaging sections 18 of the printer cover 9 by the rotation of the interlocking rotating section 17, whereby the lock on the printer cover 9 can be released. In addition, the engaging sections 18 of the printer cover 9 can be unfailingly lifted upward by the lifting upward sections 21, whereby the printer cover 9 can be favorably opened.

In addition, in the cover opening and closing apparatus 11, a waterproof gasket 9a is provided on the periphery edge portion of the recording paper storage section 7 corresponding to the outer periphery edge portion of the printer cover 9. The waterproof gasket 9a comes into elastic contact with the outer periphery edge portion of the printer cover 9 when in a state where the printer cover 9 conceals the recording paper storage section 7. As a result of this configuration, the outer periphery edge portion of the printer cover 9 is in pressing contact with the waterproof gasket 9a when the lock sections 20 are engaged by being inserted into the groove sections 18a of the engaging sections 18 of the printer cover 9. Therefore, drip-proofness of the recording paper storage section 7 can be ensured.

Furthermore, in the cover opening and closing apparatus 11, the operating members 13 respectively include an operation rotating sections 15 that are rotatably attached to the device case 1 and rotate the lock member 14, and the operating lever sections 16 that are exposed outside of the device case 1 and rotate the operation rotating section 15.

Therefore, the operation rotating sections 15 can be unfailingly rotated and the lock members 14 can be rotated by merely rotating the operating lever sections 16.

As a result, the lock on the printer cover 9 by the lock members 14 can be easily released, and the printer cover 9 can be unfailingly lifted upward and favorably opened.

In this structure, the operation rotating sections 15 of the operating members 13 respectively include rotation shafts 15a that are rotatably provided on side surfaces of the device case 1 positioned on both sides of the recording paper storage section 7, and rotation conveyance plates 15b that are provided on the rotation shafts 15a and convey the rotation operation of the operating lever sections 16 to the interlocking rotating sections 17 of the lock members 14.

One end portion of the operating lever section 16 is attached to the rotation shaft 15a of the operation rotating section 15, and the other end portion rotates in the up/down direction while projecting towards a rotating support shaft 12 that is the rotational center of the printer cover 9.

As a result of the above configuration, rotation operability of the operating members 13 is favorable, and the interlocking rotating sections 17 of the lock members 14 can be reliably and favorably rotated.

In other words, the tip end portion 16a of the operating lever section 16 of the operating member 13 projects towards the rotating support shaft 12 that is the rotational center of the printer cover 9, whereby rotation operability of the operating lever 16 is favorable and the operating lever section 16 can be favorably rotated in a stable state.

As a result, the rotation shaft 15a of the operation rotating section 15 can reliably and favorably rotate, and also can rotate the rotation conveyance plate 15b, whereby the rotation of the rotation conveyance plate 15b can be unfailingly transmitted to the interlocking rotating section 17 of the lock member 14.

As a result of the above configuration, when the mobile information terminal is used outdoors, the roll of recording paper can be quickly and efficiently exchanged without the roll being dropped.

As described above, in the mobile information terminal, when the printer cover 9 is closed and conceal the recording paper storage section 7, the printer cover 9 can be locked by the lock members 14. In addition, when the printer cover 9 is opened, the lock on the printer cover 9 by the lock members 14 can be released, whereby the printer cover 9 can be lifted upward in the opening direction by the operating members 13 being rotated.

Therefore, in the mobile information terminal, the operation for releasing the lock on the printer cover 9 by the lock members 14 and the operation for opening the printer cover 9 can be consecutively performed as a series of operations by a simple method of rotating the operating members 13. As a result, opening and closing operability of the printer cover 9 can be improved, and a mobile information terminal having good opening and closing operability can be provided.

According to the above-described embodiment, the tip end portion 16a of the operating lever section 16 of the operating member 13 is directed to the rotating support shaft 12 side of the printer cover 9. However, the present invention is not limited thereto. For example, the tip end portion 16a of the operating lever section 16 may be directed to the opposite side of the rotating support shaft 12 of the printer cover 9. In this structure, the groove section 18a of the engaging section 18 of the printer cover 9 may be opened towards the opposite side of the rotating support shafts 12, and the lock section 20 of the lock member 14 and the lifting upward section 21 may be projected towards the rotating support shaft 12 side.

In addition, according to the above-described embodiment, the present invention is applied to the printer cover 9 of the printer section 6 as the cover opening and closing apparatus 11. However, the present invention is not necessarily required to applied to the printer cover 9 of the printer section 6 and can be applied to, for example, a battery cover of a battery storage section.

Furthermore, according to the above-described embodiment, the present invention is applied to a mobile information terminal. However, the present invention is not necessarily required to be applied to a mobile information terminal, and can be applied to electronic devices such as mobile personal computers.

While the present invention has been described with reference to the preferred embodiments, it is intended that the invention be not limited by any of the details of the description therein but includes all the embodiments which fall within the scope of the appended claims.

What is claimed is:

1. An electronic device comprising:
a cover which is rotatably attached in an openable/closable manner to a device case and conceals a storage section provided in the device case;
an operating member which is rotatably attached to the device case and exposed outside of the device case, and in which a rotation shaft for rotating an operating section is positioned near a user holding the device case and the operating section extends from the rotation shaft and towards a direction away from the user; and
a cover opening section which lifts a portion of the cover upward corresponding to a rotation operation of the operating member, and opens an opening of the cover towards the user,
wherein the cover opening section comprises:
an interlocking rotating section which rotates in response to rotation of the operating member;
a lock section which is provided in the interlocking rotating section, and which engages with an engaging section of the cover and locks the cover in a state where the cover conceals the storage section; and
a lifting upward section which is provided in the interlocking rotating section and lifts the cover upward in the opening direction when the lock on the cover by the lock section is released.

2. The electronic device according to claim 1, wherein the engaging section of the cover has a groove section which is opened in a direction perpendicular to the opening and closing direction of the cover,
wherein the lock section is a projecting section which is inserted into the groove section of the engaging section and presses downward on the cover, and
wherein the lifting upward section is a projecting section which lifts the engaging section upward by the rotation operation of the operating member when the lock section is disengaged from the groove section.

3. The electronic device according to claim 1, wherein one side of the cover and the storage section comprise a waterproof gasket,
wherein the waterproof gasket is provided on one side of an outer periphery edge portion of the cover and an outer edge portion of the storage section corresponding to the outer periphery edge portion, and on other side comes into elastic contact with the outer periphery edge portion of the cover and the outer edge portion of the storage section that corresponds to the outer periphery edge portion, when in a state where the cover conceals the storage section.

4. The electronic device according to claim 1, wherein the operating member comprises:
an operation rotating section which is rotatably attached to the device case and rotates the cover opening section; and
an operating lever section which is exposed to outside of the device case and rotates the operation rotating section.

5. The electronic device according to claim 4, wherein the operation rotating section of the operating member includes:
a rotation shaft which is rotatably provided on a side surface of the device case positioned on both sides of the storage section; and
a rotation conveyance plate which is provided on the rotation shaft and conveys the rotation operation of the operating lever section to the interlocking rotating section of the cover opening section,
wherein the operating lever section one end of is attached to the rotation shaft of the operation rotating section, and other end rotates in an up/down direction in a state projected towards a rotational center of the cover.

6. An electronic device comprising:
- a cover which is rotatably attached in a range of first movable angles to a device case in an openable/closable manner and conceals a storage section provided in the device case;
- an operating member which is rotatably attached in a range of second movable angles to the device case and exposed outside of the device case;
- a lock member which locks the cover in a state where the cover conceals the storage section, unlocks the cover in response to one end of the operating member being pressed downward, and lifts the cover upward in an opening direction in response to a portion of the cover being pressed upward,
- wherein the lock member comprises:
- an interlocking rotating section which rotates by a rotation operation of the operating member;
- a lock section which is provided in the interlocking rotating section, and which engages with an engaging section of the cover and locks the cover in a state where the cover conceals the storage section; and
- a lifting upward section which is provided in the interlocking rotating section and lifts the cover upward when the lock on the cover by the lock section is released,
- wherein the cover and the operating member are attached to the device case such that the cover rotates in a direction opposite to a direction in which the operating member is rotated, in conjunction with the rotation operation of the operating member.

* * * * *